(12) United States Patent
Hess

(10) Patent No.: US 8,786,361 B1
(45) Date of Patent: Jul. 22, 2014

(54) HIGH ACCURACY ANALOG INTERFACE PROCESSING CIRCUIT

(71) Applicant: Hamilton Sundstrand Corporation, Windsor Locks, CT (US)

(72) Inventor: Gary L. Hess, Enfield, CT (US)

(73) Assignee: Hamilton Sundstrand Corporation, Windsor Locks, CT (US)

( * ) Notice: Subject to any disclaimer, the term of this patent is extended or adjusted under 35 U.S.C. 154(b) by 0 days.

(21) Appl. No.: 13/789,813

(22) Filed: Mar. 8, 2013

(51) Int. Cl.
*G05F 1/10* (2006.01)
*G05F 3/02* (2006.01)
*H03K 17/14* (2006.01)

(52) U.S. Cl.
CPC .................................... *H03K 17/145* (2013.01)
USPC ........................... 327/544; 327/434; 327/437

(58) Field of Classification Search
USPC .............. 327/544, 141, 144–163; 331/15–17; 375/373–376
See application file for complete search history.

(56) References Cited

U.S. PATENT DOCUMENTS

| | | | |
|---|---|---|---|
| 4,340,881 A | 7/1982 | Stack et al. | |
| 6,134,279 A * | 10/2000 | Soichi et al. | 375/341 |
| 6,323,539 B1 | 11/2001 | Fujihira et al. | |
| 6,335,647 B1 * | 1/2002 | Nagano | 327/161 |
| 6,456,145 B1 * | 9/2002 | Pertijs et al. | 327/362 |
| 7,692,179 B2 | 4/2010 | Islam et al. | |
| 2004/0183511 A1 * | 9/2004 | Dening | 323/282 |
| 2005/0093619 A1 * | 5/2005 | Naffziger et al. | 327/543 |
| 2009/0176471 A1 * | 7/2009 | Ishiguro | 455/317 |
| 2010/0117723 A1 * | 5/2010 | Choi | 327/552 |
| 2011/0268151 A1 | 11/2011 | Hadwen et al. | |
| 2012/0112808 A1 * | 5/2012 | Yotsuji | 327/156 |
| 2012/0185116 A1 | 7/2012 | Defrancesco | |
| 2012/0212164 A1 | 8/2012 | Terakawa et al. | |
| 2012/0241829 A1 | 9/2012 | Khan et al. | |
| 2013/0057230 A1 * | 3/2013 | Lim et al. | 323/209 |

\* cited by examiner

*Primary Examiner* — Brandon S Cole
(74) *Attorney, Agent, or Firm* — Carlson, Gaskey & Olds, P.C.

(57) ABSTRACT

An analog interface processing circuit includes a first and second signal processing interface, a processing system connected to the first and second signal processing interfaces, a biasing voltage source switchably coupled to said first signal processing interface via a first switch assembly and switchably coupled to said second signal processing interface via a second switch assembly, and a first control output of said processing system controllably coupled to said first switch assembly and a second control output of said processing system controllably couple to said second switch assembly.

19 Claims, 5 Drawing Sheets

HIGH ACCURACY ANALOG INTERFACE PROCESSING CIRCUIT

TECHNICAL FIELD

The present disclosure relates generally to signal processing, and more particularly to a high accuracy analog interface processing circuit.

BACKGROUND OF THE INVENTION

Aerospace sensor system designs, such as those used to monitor and control commercial aircraft, require some sensor systems to be measured at an extremely high accuracy to prevent control errors. By way of example, one such system is a pressure system. It is understood that the accuracy of some sensor types adjusts depending on the temperature at which the sensor and the associated circuitry is operating. As a result of the extreme levels accuracy required, and the high temperature variations the sensor circuitry experiences during engine operation, the sensor system is calibrated including temperature calibrations of the sensor and the associated circuitry.

Current calibration processes do not account for the effects of ionic contamination within the sensor interfaces for the signal processing system. Ionic contamination occurs slowly over time as a result of ordinary sensor use. The lack of accounting for ionic contamination during calibration causes a decline in performance over time due to a decline in repeatability, and a corresponding loss in accuracy.

SUMMARY OF THE INVENTION

Disclosed is a sensor processing circuit including a first and second signal processing interface, a processing system connected to an output of each of the first and second signal processing interfaces, a biasing voltage source switchably coupled to the first signal processing interface via a first switch assembly and switchably coupled to the second signal processing interface via a second switch assembly, and a first control output of the processing system controllably coupled to the first switch assembly and a second control output of the processing system controllably couple to the second switch assembly.

Also disclosed is a method for processing sensor inputs of a sensor system including the steps of: receiving a sensor signal at least two signal processing interfaces, connecting a first of the at least two signal processing interfaces to a biasing voltage source, thereby causing the first signal processing interface to pass a sensor signal to a signal processor, disconnecting the first of the at least two signal processing interfaces from the biasing voltage and connecting a second of the signal processing interfaces to the biasing voltage while the sensor system is operating at a high temperature, thereby counteracting an ionic contamination of said first of said at least two signal processing interfaces.

Also disclosed is an aircraft sensor configuration including at least one analog sensor, a first and second signal processing interface, a processing system connected to an output of each of the first and second signal processing interfaces, a biasing voltage source switchably coupled to the first signal processing interface via a first switch assembly and switchably coupled to the second signal processing interface via a second switch assembly, and a first control output of the processing system controllably coupled to the first switch assembly and a second control output of the processing system controllably couple to the second switch assembly.

These and other features of the present invention can be best understood from the following specification and drawings, the following of which is a brief description.

DETAILED DESCRIPTION OF AN EMBODIMENT

Figure 1:
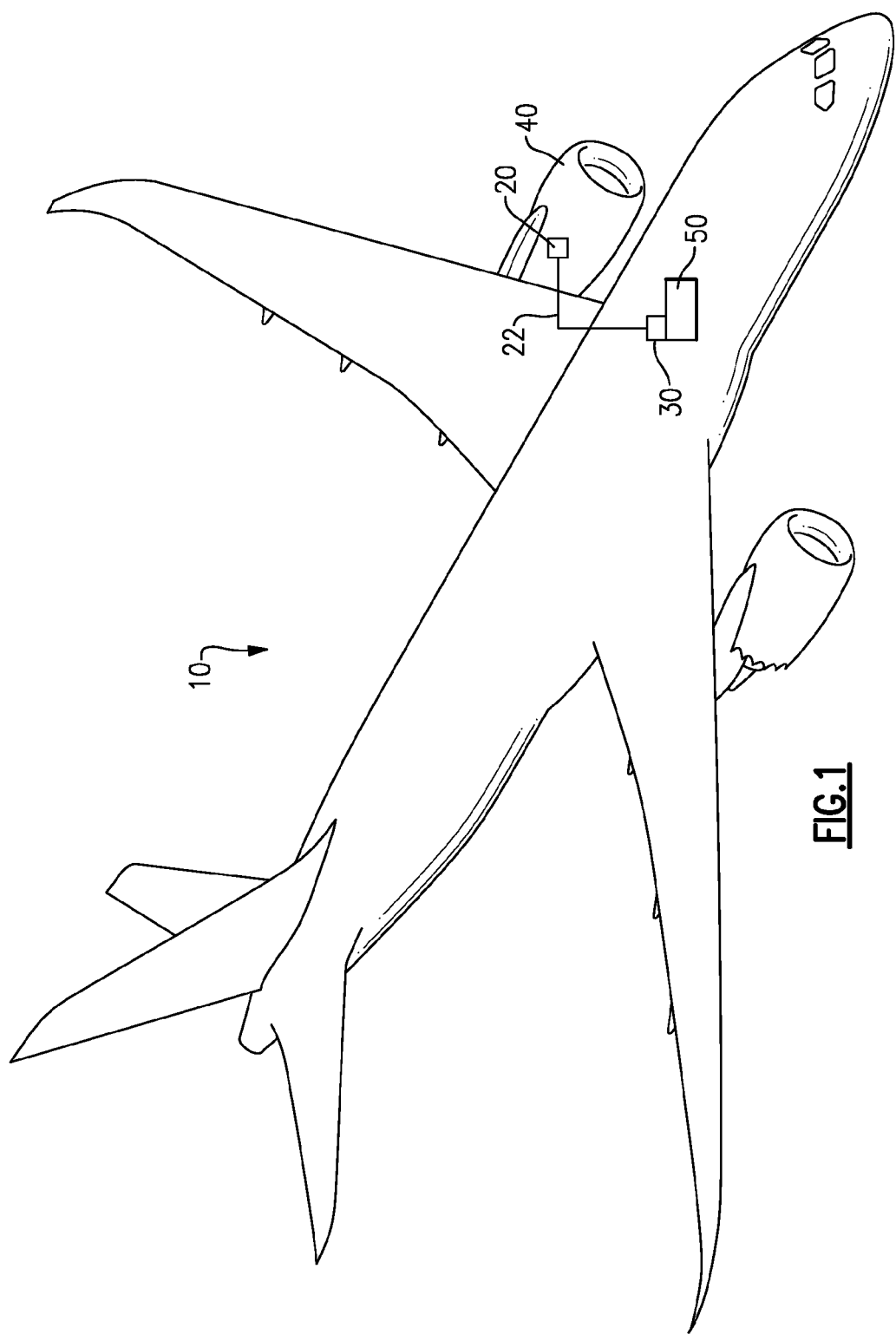
FIG. 1 schematically illustrates an aircraft including a sensor arrangement.

FIG. 1 illustrates an example aircraft 10 including a sensor 20 on an aircraft engine 40. The sensor 20 is connected to a controller 50, such as a signal processor, via a signal processing interface 30 and a sensor wire 22. Some engine systems require sensed information, such as pressure, to be sensed at an extremely high accuracy using analog sensors 20. Operation of the sensor interfaces 30 connecting the signal wire 22 from the sensor 20 to the controller 50 (the signal processor) at extreme temperatures, such as those typically found in an operating jet engine 40, can exacerbate the affects of ionic contamination that occurs in the sensor interface 30. The ionic contamination affects the sensor readings, potentially moving the readings out of allowed tolerances.

With ordinary sensor arrangements, the minor affect of ionic contamination is within tolerances and does not require compensation. However, in systems requiring extremely accurate sensors, the ionic contamination can affect the sensor readings beyond tolerances, and result in inaccurate readings of the sensor 20.

Figure 2A:
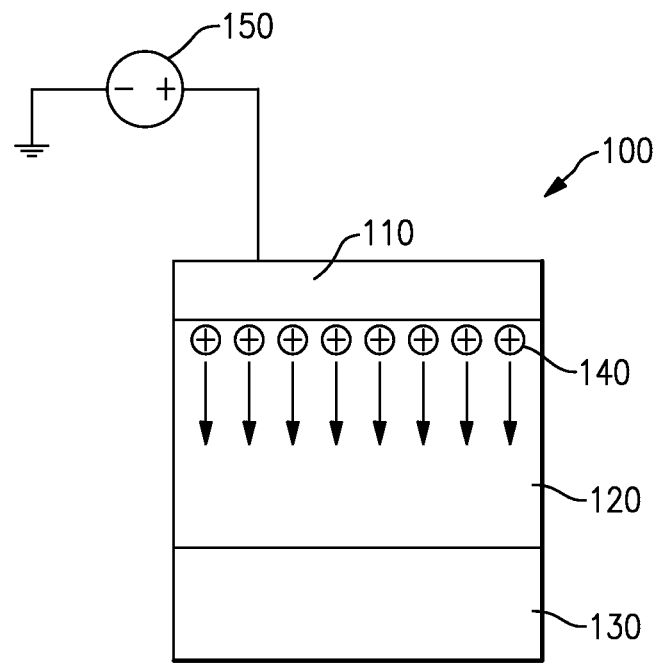
FIG. 2A schematically illustrates a silicon junction diagram for a signal processing interface immediately after receiving a bias power.

FIG. 2A illustrates a PN junction 100 within an example sensor interface using a gate material layer 110 positioned on an oxide material layer 120. The oxide material layer 120 is attached to a substrate 130, such as silicon. This arrangement is a standard PN junction arrangement. A biasing voltage source 150 is switchably connected to the sensor interface 100. When the biasing voltage source 150 is providing power to the sensor interface, sensor signals entering the sensor interface are passed to the controller 50. Conversely, when the biasing voltage 150 is switched off (disconnected from the sensor interface), the sensor interface does not pass sensor signals to the controller 50.

When the PN junction 100 of the sensor interface is biased, ions 140 in the oxide material layer 120 that are normally located near the gate material layer 110 begin to migrate toward the substrate 130. Exposure to high temperatures, such as those experienced in a turbine engine, causes the ions 140 to migrate faster. As the ions 140 migrate, the sensor readings are affected, resulting in ionic contamination.

Figure 2B:
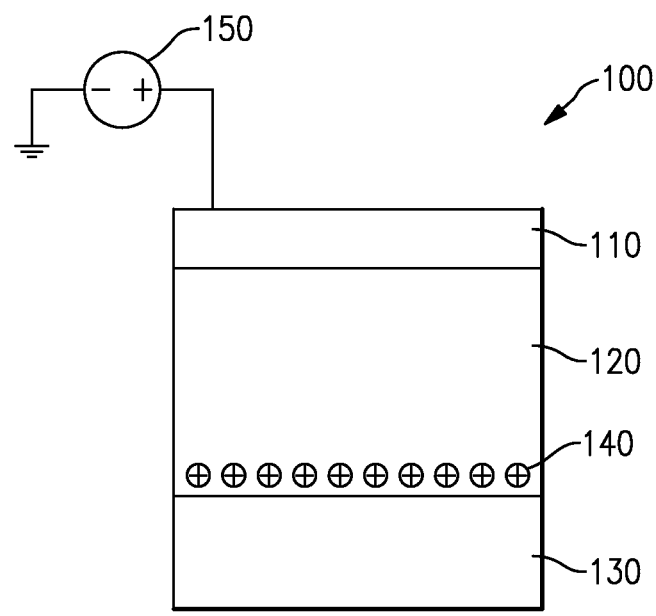
FIG. 2B schematically illustrates a silicon junction diagram for a signal processing interface after ionic contamination.

FIG. 2B illustrates the same PN junction 100 of the sensor interface illustrated in FIG. 2A, with like numerals indicating like elements. The illustration of FIG. 2B shows the ions 140 in position after the PN junction 100 has been biased for a sufficient time period to allow all the ions 140 to migrate to the substrate side of the oxide material layer 120. Ordinarily, once the ions 140 have migrated, it takes a significant time period for the ions 140 to migrate back to the original positions when the PN junction 100 is unbiased.

It has been discovered that the ions 140 migrate back to their original positions significantly faster when the PN junction 100 is unbiased at high temperatures, than when the PN junction 100 is unbiased at standard or low temperatures. The rate at which the ions 140 migrate back to their original positions when the PN junction is unbiased at extremely high temperatures is orders of magnitude higher than the rate of ion migration in a biased sensor interface 100 operating at the same temperature. This relationship causes ionic contamination in an unbiased PN junction 100 to correct at a significantly faster rate than it occurs in a biased PN junction 100 at high temperatures.

Figure 3:
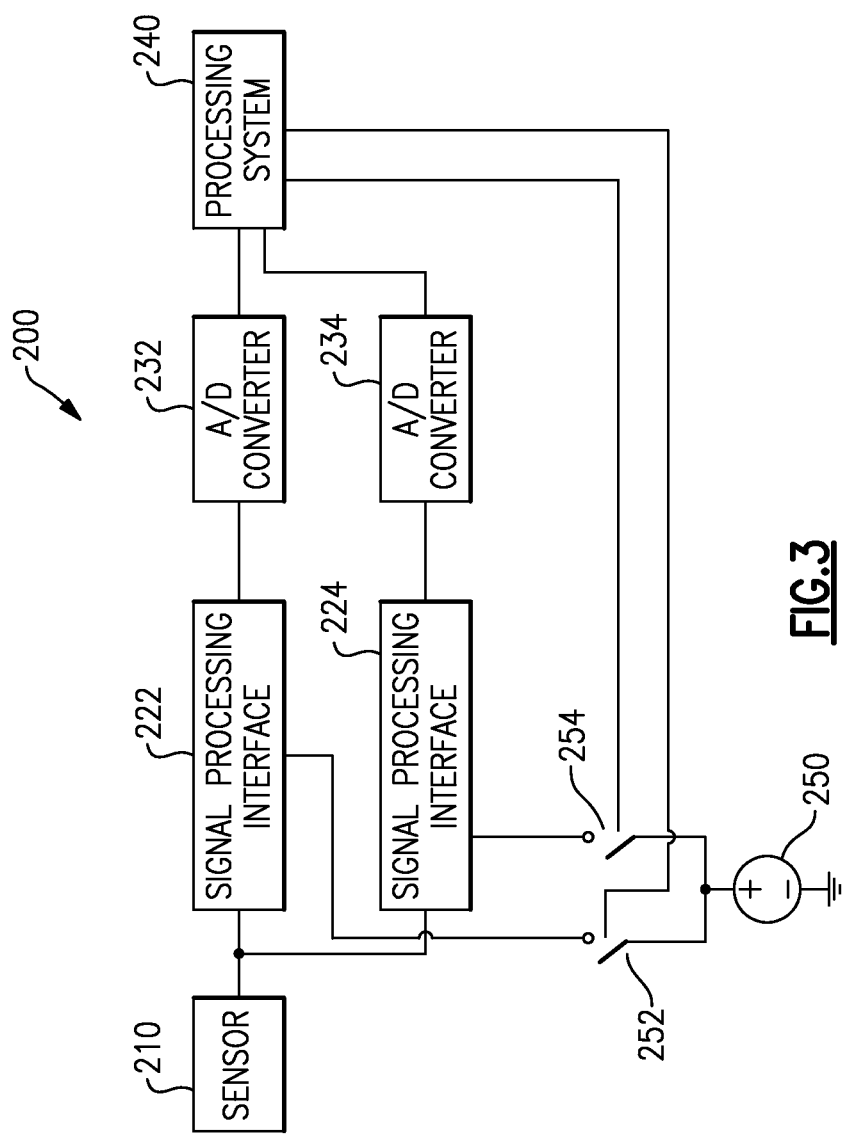
FIG. 3 schematically illustrates a first sensor arrangement.

FIG. 3 schematically illustrates a highly accurate sensor arrangement 200 utilizing the above described ionic contamination properties to counteract the affects of ionic contamination and achieve a highly accurate sensor arrangement 200 that remains within tolerances at high temperatures. The sensor arrangement 200 includes an analog sensor 210 that outputs a sensor signal to two independent signal processing interfaces 222, 224. Each of the signal processing interfaces 222, 224 is connected to a dedicated analog to digital converter 232, 234, which converts the sensor signal to a digital signal readable by a processing system 240, such as a controller. Each of the signal processing interfaces 222, 224 is also switchably connected to a biasing voltage source 250 via a switch 252, 254. The switches 252, 254 are connected to the processing system 240, and the processing system 240 controls the connection between the biasing voltage source 250 and each of the signal processing interfaces 222, 224. In alternate configurations, the switches 252, 254 can be controlled by a separate controller.

During operation of the sensor arrangement 200, at least one switch 252, 254 is closed at any given time, thereby resulting in one of the signal processing interfaces 222, 224 being biased at all times. The biased signal processing interface 222, 224 is alternated between the two signal processing interfaces 222, 224.

In order to prevent ionic contamination from affecting the sensor readings and placing the readings out of accuracy tolerances, the length of time each signal processing interface 222, 224 is biased is significantly shorter than the length of time required for the ionic contamination to place the signal processing interface 222, 224 out of tolerance. By way of example, if the time period required for the signal processing interface 222, 224 to be contaminated out of tolerances is one hour, the signal processing interfaces 222, 224 can be alternated with each interface 222, 224 being biased for five minutes before switching to the other signal processing interface 222, 224. The actual biasing time for a practical system will vary depending on design parameters and is not limited to five minutes.

As the rate of ions returning to the unbiased state is magnitudes faster than the contamination rate, each signal processing interface 222, 224 returns to an uncontaminated state after being unbiased in significantly less time than it took for the ionic contamination to occur. Thus, the unbiased signal processing interface 222, 224 will return to the unbiased state well before it is biased again as a result of the timed alternating of the biased signal processing interface 222, 224. It is further understood based upon the above described system that additional signal processing interfaces 222, 224 can be included beyond two and achieve the same affect.

Figure 4:
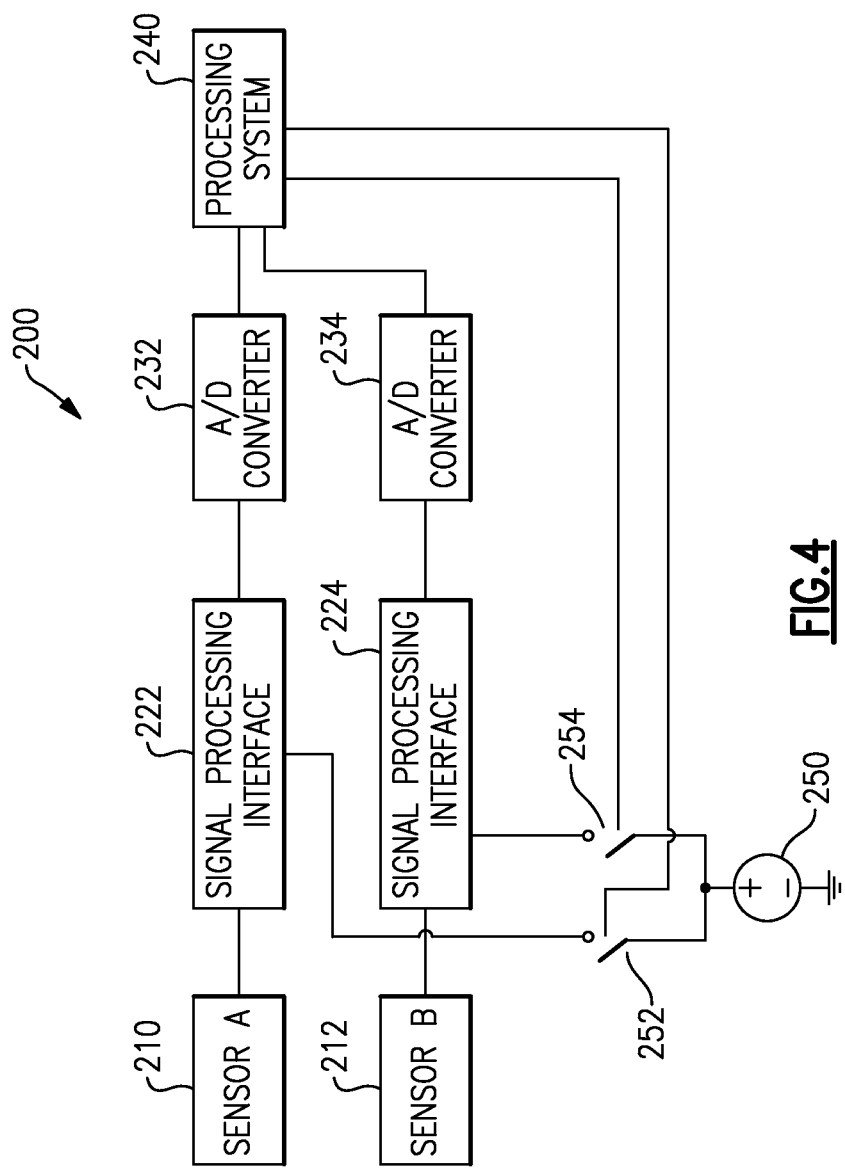
FIG. 4 schematically illustrates a second sensor arrangement.

FIG. 4 schematically illustrates an alternate example arrangement for the sensor arrangement 200 illustrated in FIG. 3, with like numerals indicating like elements. The example sensor arrangement 200 of FIG. 4 includes an additional sensor 212 beyond the first sensor 210. The additional sensor 212 and the original sensor 210 are identical sensors and provide identical readings. The incorporation of the additional sensor 212 adds redundancy to the system 200, further increasing its robustness.

While the example illustrated in FIGS. 3 and 4 utilize individual switches 252, 254 to control the connection between the biasing voltage source 250 and the signal processing interface 222, 224, alternate switching arrangements designed to ensure that at least one of the signal processing interfaces 222, 224 is biased at any given time can be utilized to the same effect in place of the switches 252, 254.

Figure 5:
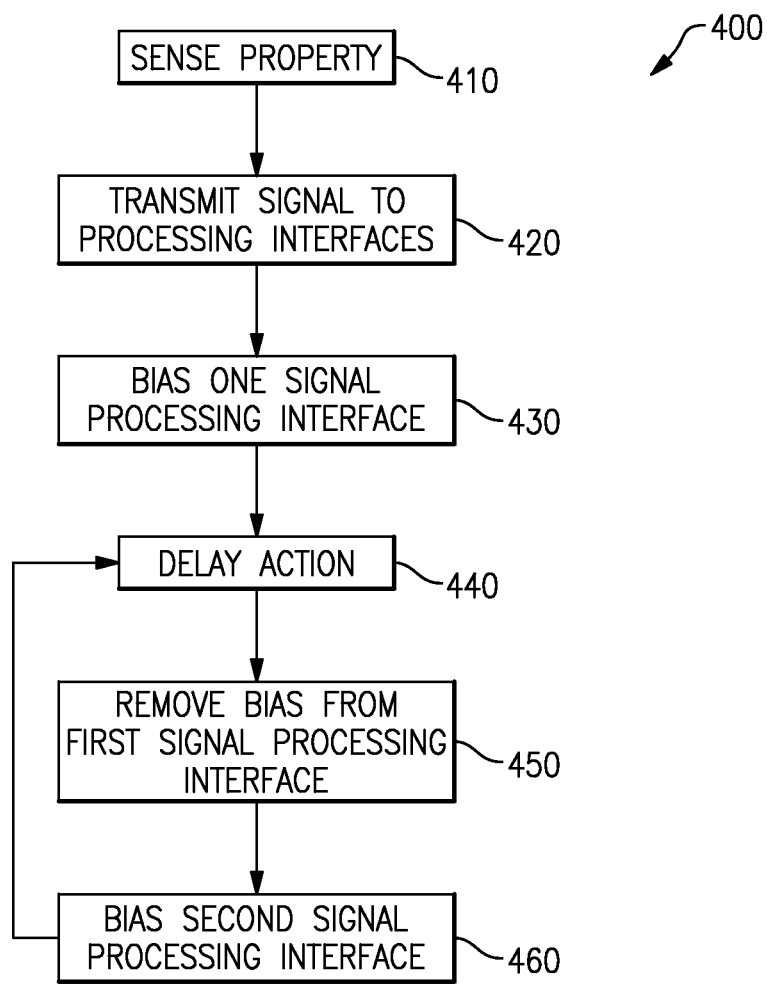
FIG. 5 illustrates a flowchart demonstrating a method of operating a sensor arrangement.

FIG. 5 illustrates a flowchart demonstrating a method for operating the sensor arrangements 200 illustrated in FIGS. 3 and 4. Instructions for causing the sensor arrangement to perform the method can be stored in the processing system 240 on a memory. Initially the sensor 210, 212 senses an engine property, such as pressure, in a "Sense Property" step 410. The sensor 210, 212 then transmits the sensed value to each of the signal processing interfaces 222, 224 in the example of FIG. 3 and to the corresponding signal processing interface 222, 224 in the example of FIG. 4 in a "Transmit Signal to Processing Interfaces" step 420.

At the same time, the biasing voltage source 250 is connected to one of the signal processing interfaces 222, 224, biasing the signal processing interface and causing the signal processing interface 222, 224 to transmit the sensor signal from the sensor 210, 212 to the A/D converters 232, 234 and the processing system 240 in a "Bias One Signal Processing Interface" step 430. As described above, the biasing of the signal processing interface also causes the biased signal processing interface 222, 224 to undergo ionic contamination, reducing the accuracy of the sensor 210, 212.

The processing system 240 delays action for a set time period in a "Delay Action" step 440. The delay allows the currently biased signal processing interface 222, 224 to continue operating while the signal processing interface 222, 224 is within tolerances, without requiring an immediate switch. Once the time period has elapsed, the processing system 240 disconnects the biasing voltage source 250 from the currently operating signal processing interface in a "Remove Bias From First Signal Processing Interface" step 450 and applies a bias to the second signal processing interface 222, 224 in a "Bias Second Signal Processing Interface" step 460. The "Remove Bias From First Signal Processing Interface" step 450 and the "Bias Second Signal Processing Interface" step 460 are performed simultaneously or approximately simultaneously, thereby ensuring an uninterrupted flow of sensor readings to the processing system 240.

The method 400 for operating the sensor arrangement 200, then repeats the "Delay Action" step 440, "Remove Bias From First Signal Processing Interface" step 450 and the "Bias Second Signal Processing Interface" step 460 for as long as the sensor 210 is operating.

In alternate arrangements, the processing system 240 can detect when the ionic contamination of the operating signal processing interface 222, 224 has exceed an allowable threshold by checking the received sensor signal for errors, sensing the signal processing interface 222, 224, or any other method. In the alternate arrangement, the processing system 240 can unbias and rebias the signal processing interfaces whenever the current operating signal processing interface 222, 224 exceeds the contamination threshold rather then relying on a set timer, as in the above example. The alternate example achieves the same effect of allowing the ionic contamination in the signal processing interfaces to correct while at the same time providing a functional highly accurate sensor reading.

While each of the above examples describes utilizing an analog sensor connected to a digital processing system using an analog to digital converter, it is understood that the same benefit can be achieved in similar systems not including an analog to digital converter.

It is further understood that any of the above described concepts can be used alone or in combination with any or all of the other above described concepts. Although an embodiment of this invention has been disclosed, a worker of ordinary skill in this art would recognize that certain modifications would come within the scope of this invention. For that reason, the following claims should be studied to determine the true scope and content of this invention.

The invention claimed is:

1. An sensor processing circuit comprising:
    a first and second signal processing interface;
    a processing system connected to an output of each of said first and second signal processing interfaces;
    a biasing voltage source switchably coupled to said first signal processing interface via a first switch assembly and switchably coupled to said second signal processing interface via a second switch assembly; and
    a first control output of said processing system controllably coupled to said first switch assembly and a second control output of said processing system controllably couple to said second switch assembly;
    wherein said processing system includes a memory storing instructions operable to cause said sensor processing circuit to perform the steps of:
    connecting a first of said first and second signal processing interfaces to the biasing voltage source, thereby causing said first signal processing interface to pass a sensor signal to the processing system;
    disconnecting said first of said first and second processing interfaces from said biasing voltage source and connecting a second of said signal processing interfaces to said biasing voltage source while said sensor system is operating at a high temperature;
    disconnecting said second of said at least two signal processing interfaces from said biasing voltage and connecting a first of said signal processing interfaces to said biasing voltage while said sensor system is operating at a high temperature; and
    alternating the steps of disconnecting said first of said first and second processing interfaces from said biasing voltage source and connecting a second of said signal processing interfaces to said biasing voltage source while said sensor system is operating at a high temperature and disconnecting said second of said at least two signal processing interfaces from said biasing voltage and connecting a first of said signal processing interfaces to said biasing voltage while said sensor system is operating at a high temperature, at a set time period, wherein said set time period is substantially less than a time period required for ionic contamination to place said sensor signals out of tolerance.

2. The sensor processing circuit of claim 1, wherein said processing system is connected to said outputs of each of said first and second signal processing interfaces via at least one analog to digital converter.

3. The sensor processing circuit of claim 1, wherein each of said first and second signal processing interfaces are connected to an analog sensor.

4. The sensor processing circuit of claim 3, wherein each of said first and second signal processing interfaces is connected to a single analog sensor.

5. The sensor processing circuit of claim 3, wherein each of said first and second signal processing interfaces is connected to distinct analog sensors, and wherein each of the distinct analog sensors are redundant with each other.

6. The sensor processing circuit of claim 1, wherein each of said first and second signal processing interface includes a PN junction interface.

7. A method for processing sensor inputs of a sensor system comprising the steps of:
    receiving a sensor signal at least two signal processing interfaces;
    connecting a first of said at least two signal processing interfaces to a biasing voltage source, thereby causing said first signal processing interface to pass a sensor signal to a signal processor;
    disconnecting said first of said at least two signal processing interfaces from said biasing voltage and connecting a second of said signal processing interfaces to said biasing voltage while said sensor system is operating at a high temperature, thereby counteracting an ionic contamination of said first of said at least two signal processing interfaces; and alternating the steps of disconnecting said first of said first and second processing interfaces from said biasing voltage source and connecting a second of said signal processing interfaces to said biasing voltage source while said sensor system is operating at a high temperature and disconnecting said second of said at least two signal processing interfaces from said biasing voltage and connecting a first of said signal processing interfaces to said biasing voltage while said sensor system is operating at a high temperature, at a set time period, wherein said set time period is substantially less than a time period required for ionic contamination to place said sensor signals out of tolerance.

8. The method of claim 7, further comprising the step of disconnecting said second of said at least two signal processing interfaces from said biasing voltage and connecting a first of said signal processing interfaces to said biasing voltage while said sensor system is operating at a high temperature, thereby counteracting an ionic contamination of said second of said at least two signal processing interfaces.

9. The method of claim 8, wherein said steps of disconnecting said first of said at least two signal processing interfaces from said biasing voltage and connecting a second of said signal processing interfaces to said biasing voltage while said sensor system is operating at a high temperature, thereby counteracting an ionic contamination of said first of said at least two signal processing interfaces and disconnecting said second of said at least two signal processing interfaces from said biasing voltage and connecting a first of said signal processing interfaces to said biasing voltage while said sensor system is operating at a high temperature, thereby counteracting an ionic contamination of said second of said at least two signal processing interfaces are alternated at a set time period.

10. The method of claim 9, wherein said set time period is substantially less than a time period required for ionic contamination to place said sensor signals out of tolerance.

11. The method of claim 10, wherein said set time period is less than or equal to five minutes.

12. The method of claim 7, wherein said step of disconnecting said first of said at least two signal processing interfaces from said biasing voltage and connecting a second of said signal processing interfaces to said biasing voltage while said sensor system is operating at a high temperature, thereby counteracting an ionic contamination of said first of said at least two signal processing interfaces is performed when an ionic contamination of said first signal processing interface exceeds a threshold.

13. The method of claim 12, further comprising the step of disconnecting said second of said at least two signal processing interfaces from said biasing voltage and connecting a first of said signal processing interfaces to said biasing voltage while said sensor system is operating at a high temperature when an ionic contamination of the second signal processing interface exceeds a threshold, thereby counteracting an ionic contamination of said second of said at least two signal processing interfaces.

14. An aircraft sensor configuration comprising:
   at least one analog sensor;
   a first and second signal processing interface;
   a processing system connected to an output of each of said first and second signal processing interfaces;
   a biasing voltage source switchably coupled to said first signal processing interface via a first switch assembly and switchably coupled to said second signal processing interface via a second switch assembly; and
   a first control output of said processing system controllably coupled to said first switch assembly and a second control output of said processing system controllably couple to said second switch assembly;
   wherein said processing system includes a memory storing instructions operable to cause said sensor processing circuit to perform the steps of:
   connecting a first of said first and second signal processing interfaces to the biasing voltage source, thereby causing said first signal processing interface to pass a sensor signal to the processing system;
   disconnecting said first of said first and second processing interfaces from said biasing voltage source and connecting a second of said signal processing interfaces to said biasing voltage source while said sensor system is operating at a high temperature;
   disconnecting said second of said at least two signal processing interfaces from said biasing voltage and connecting a first of said signal processing interfaces to said biasing voltage while said sensor system is operating at a high temperature; and alternating the steps of disconnecting said first of said first and second processing interfaces from said biasing voltage source and connecting a second of said signal processing interfaces to said biasing voltage source while said sensor system is operating at a high temperature and disconnecting said second of said at least two signal processing interfaces from said biasing voltage and connecting a first of said signal processing interfaces to said biasing voltage while said sensor system is operating at a high temperature, at a set time period, wherein said set time period is substantially less than a time period required for ionic contamination to place said sensor signals out of tolerance.

15. The aircraft sensor configuration of claim 14, wherein said processing system is connected to said outputs of each of said first and second signal processing interfaces via at least one analog to digital converter.

16. The aircraft sensor configuration of claim 14, wherein each of said first and second signal processing interfaces are connected to an analog sensor.

17. The aircraft sensor configuration of claim 16, wherein each of said first and second signal processing interfaces is connected to a single analog sensor.

18. The aircraft sensor configuration of claim 16, wherein each of said first and second signal processing interfaces is connected to distinct analog sensors, and wherein each of the distinct analog sensors are redundant with each other.

19. The aircraft sensor configuration of claim 14, wherein each of said first and second signal processing interface includes a PN junction interface.

* * * * *

UNITED STATES PATENT AND TRADEMARK OFFICE
CERTIFICATE OF CORRECTION

Page 1 of 1

PATENT NO.       : 8,786,361 B1
APPLICATION NO.  : 13/789813
DATED            : July 22, 2014
INVENTOR(S)      : Gary L. Hess It is certified that error appears in the above-identified patent and that said Letters Patent is hereby corrected as shown below:

On the title page, under abstract "19 Claims, 5 Drawing Sheets" should read --16 Claims, 5 Drawing Sheets--.

IN THE CLAIMS:

Column 6, line 62, in claim 11; delete "10" and replace with --7--.

Column 6, lines 38-61, Delete claims 8-10;

Renumber claims 11-19 as claims 8-16.

Signed and Sealed this
Second Day of December, 2014

Michelle K. Lee
*Deputy Director of the United States Patent and Trademark Office*